United States Patent [19]

Howard et al.

[11] Patent Number: 5,161,086
[45] Date of Patent: Nov. 3, 1992

[54] CAPACITOR LAMINATE FOR USE IN CAPACITIVE PRINTED CIRCUIT BOARDS AND METHODS OF MANUFACTURE

[75] Inventors: James R. Howard, Sacramento; Gregory L. Lucas, Newark, both of Calif.

[73] Assignee: Zycon Corporation, Santa Clara, Calif.

[21] Appl. No.: 823,865

[22] Filed: Jan. 22, 1992

Related U.S. Application Data

[60] Division of Ser. No. 521,588, May 10, 1990, and a continuation-in-part of Ser. No. 397,518, Aug. 23, 1989, Pat. No. 5,079,069.

[51] Int. Cl.$^5$ .......................... H01G 4/10; H05K 1/18
[52] U.S. Cl. ...................................... 361/321; 361/401
[58] Field of Search ................ 428/209; 361/306, 321, 361/397, 401; 29/625, 628; 357/74, 23.5

[56] References Cited

U.S. PATENT DOCUMENTS

4,584,627 4/1986 Schilling et al. ................. 361/306
5,079,069 1/1992 Howard et al. ................... 428/209

Primary Examiner—Donald A. Griffin
Attorney, Agent, or Firm—John A. Bucher

[57] ABSTRACT

A capacitor laminate is described either as an intermediate product for use in a capacitive printed circuit board or as part of the assembled printed circuit board in order to provide a bypass capacitive function for large numbers of devices mounted or formed on the printed circuit board, the capacitor laminate being formed from sheets of conductive material and an intermediate sheet of dielectric material forming the laminated capacitor as a structurally rigid assembly and facilitating its inclusion within the PCB, components of the capacitor laminate having selected characteristics whereby each individual device is provided with capacitance by a proportional portion of the capacitor laminate and by borrowed capacitance from other portions of the capacitor laminate, the capacitive function of the capacitor laminate being dependent upon random firing or operation of the devices. Methods of manufacture for the capacitor laminate as well as the capacitive PCB are also described. The capacitor laminate of the present invention is preferably formed with preferred surface treatment or surface characteristics on the conductive foils employed therein.

18 Claims, 4 Drawing Sheets

CAPACITOR LAMINATE FOR USE IN CAPACITIVE PRINTED CIRCUIT BOARDS AND METHODS OF MANUFACTURE

This is a division of application Ser. No. 07/521,588 filed May 10, 1990 and a continuation-in-part of application Ser. No. 07/397,518 filed Aug. 23, 1989 and now U.S. Pat. No. 5,079,069 issued Jan. 7, 1992.

FIELD OF THE INVENTION

The present invention relates to a capacitor laminate forming a layer within a capacitive printed circuit board to provide a capacitive function for large numbers of devices mounted or formed on the board and methods of manufacture therefor.

BACKGROUND OF THE INVENTION

Printed circuit boards (PCBs) have long been formed as laminated structures upon which large numbers of devices such as integrated circuits are mounted or formed for use in a wide variety of electronic applications. Typically, these printed circuit boards have been formed with internal power and ground planes, or conductive sheets, the various devices including traces or electrical connections with both the power and ground planes for facilitating their operation.

Substantial effort has been expended in the design of such PCBs and the device arranged thereupon to compensate for voltage fluctuations arising between the power and ground planes in the PCBs, particularly for sensitive devices such as integrated circuits mounted or formed on the board surface and connected with both the power and ground planes for operation.

The voltage fluctuations referred to above are commonly caused by the integrated circuits switching on and off, the fluctuations resulting in "noise" which is undesirable and/or unacceptable in many applications.

A common solution to this problem in the past has been the provision of surface capacitors connected directly with the integrated circuits in some cases and connected with the power and ground planes in the vicinity of the selected integrated circuit in other cases. In any event, the surface capacitors were formed or mounted upon the surface of the PCB and connected with the respective devices or integrated circuits, etc. either by surface traces or by through-hole connections, for example.

Generally, surface capacitors have been found effective to reduce or, in other words, to smooth the undesirable voltage fluctuations referred to above. However, surface or bypass capacitors have not always been effective in all applications. For example, the capacitors themselves tend to affect "response" of the integrated circuits or other devices because they have not only a capacitive value but an inductive value as well. It is, of course, well known that inductance arises because of currents passing through conductors such as the traces or connectors coupling the capacitors with the devices or power and ground planes.

Furthermore, as was also noted above, the integrated circuits or other devices are a primary source of radiated energy creating noise from voltage fluctuations in the printed circuit boards. Different characteristics are commonly observed for such devices operating at different speeds or frequencies. Accordingly, the PCBs and device arrays as well as associated capacitors must commonly be designed to assure necessary noise suppression at both high and low speed operation.

In any event, the design of printed circuit boards and device arrays for overcoming these problems are well known to those skilled in the art of printed circuit board design. For purposes of the present invention, it is sufficient to realize that the use of surface mounted capacitors which are individually connected with the integrated circuits or devices substantially increase the complexity and cost of manufacture for the PCBs as well as undesirably affecting their reliability.

A novel approach to overcoming this problem and greatly simplifying the design and manufacture of printed circuit boards in order to provide capacitance for large numbers of integrated circuits or devices mounted thereupon was recently set forth in a copending U.S. patent application filed by John Sisler and assigned to Convergent Technologies, Inc. That copending application is incorporated herein by reference in order to assure a more complete understanding of the present invention and also to emphasize the importance of the Sisler concept within the present invention.

The Sisler concept overcame the problem of providing individual surface capacitors for large numbers of devices or integrated circuits on the PCB by making the PCB itself a capacitive element capable of providing a capacitive function for the various integrated circuits and/or devices. More specifically, the Sisler concept contemplated forming one or more capacitive layers internally within the PCB, the conductive sheets on the capacitive layers preferably forming the power and ground planes of the PCB.

In this manner, it became possible to commonly interconnect the individual devices and/or integrated circuits with both the power and ground planes as well as the internal capacitive element of the PCB by a single pair of traces or connectors.

Thus, the Sisler design provided a number of possible important advantages in PCB design. Initially, it entirely avoided the need for most if not all of the surface capacitors on the PCB. At the same time, with the capacitive layer also forming the power and ground planes for the PCB, the Sisler design reduced the number of electrical connectors associated with the integrated circuits and/or devices by approximately 50%.

The reduction or removal of these components from the PCB not only minimized manufacturing complexity and cost for the PCB but also greatly improved its reliability. Furthermore, removal of the surface capacitors from the PCB either made the device arrays upon the PCB less dense or permitted the addition of other surface devices or circuits.

In order to achieve all of the significant and desirable advantages referred to above, the Sisler design contemplated the need for assigning or allotting localized areas or portions of the internal capacitance layer or layers to each of the individual devices and/or integrated circuits. Thus, the Sisler design contemplated the need for capacitive layers with dielectric sheets and conductive sheets of greatly reduced thicknesses and/or very high dielectric constants generally beyond the capabilities of the existing state of the art.

The Sisler concept contemplated a number of approaches for achieving the necessary capacitive values because of the design parameters discussed above. For example, the Sisler concept required very thin dielectric sheets on the order of no more than about 0.5 mils with the dielectric material having a dielectric constant as high as 200.

Such characteristics were unavailable in the existing state of the art for dielectric materials. In addition, the contemplated need for ultra-thin capacitive layers also made the capacitive layers extremely fragile and difficult to work with, even in theory.

Other techniques were also considered for overcoming these design problems. For example, consideration was given to etching of a relatively thin layer of dielectric material in order to substantially increase its surface area followed by sputtering and/or electrodeposition of conductive metal onto the dielectric material in order to achieve capacitor characteristics as needed. However, none of the approaches discussed above was found to be capable of providing a satisfactory solution to design of the internal capacitive layer for such a capacitive printed circuit board.

Accordingly, although the Sisler concept offered numerous substantial advantages in manufacturing ease and reduced cost as well as increased reliability, at least in theory, there remained a need for an effective capacitive layer to produce a working embodiment of the capacitive PCB of the Sisler concept.

SUMMARY OF THE INVENTION

Accordingly, it is an object of the present invention to provide an effective capacitor laminate for use in capacitive printed circuit boards of the type described above in order to meet design parameters for a capacitive printed circuit board and to minimize and/or eliminate one or more of the problem areas also discussed above.

The concept of the present invention was developed as an analogy to observed freeway traffic. It was noted that, during rush hour, large numbers of vehicles attempted to occupy the same "transmission" space and this resulted in the traffic speed being greatly reduced if not brought to a halt at times. By contrast, it was observed that, during ordinary non-rush times, different vehicles traveled along the same transmission channels at different times. Thus, the vehicles did not impede one another and they were able to travel at relatively high speeds.

By analogy, it was realized that electron flow or current flow initiated by operation of the respective devices and/or integrated circuits on printed boards tended to occur at different times because of their random operation. Accordingly, it was conceived that a capacitive element for the printed circuit boards could be designed to permit "borrowed" or "shared" use of capacitance capacity in the capacitor. In other words, by appropriate design of a capacitor element incorporated within the printed circuit board, it would be possible for the respective devices or integrated circuits to employ not only a specific or proportional portion of the capacitor area for each respective device but also to employ "borrowed capacitance" adjacent capacitor areas assigned or proportional to other devices and/or integrated circuits.

Because of the random operation normal for the devices and integrated circuits in such printed circuit boards, the devices tend to fire or operate over different intervals of time so that they can, in effect, employ the same capacitor area of the capacitor laminate because of the novel principle of borrowed capacitance as described above.

The concept of borrowed capacitance is made possible in a capacitor laminate, provided by the present invention as a layer in the laminated printed circuit board, by following two principles. Initially, the dielectric constant for the dielectric material is selected so that a substantially greater proportional area of the capacitor is necessary to accommodate operation of each device and/or integrated circuit. At the same time, the conductive sheets on opposite sides of the dielectric sheet are provided with sufficient conductance, preferably by increasing the relative thickness of the conductive sheets, in order to assure adequate electron or current flow for permitting the devices and/or integrated circuits to take advantage of increased capacitance resulting from the borrowed capacitance concept of the invention.

The above design considerations initially permit the material of the dielectric sheet to be selected within existing state-of-the-art parameters while also having an adequate thickness to ensure structural rigidity of the capacitor laminate. At the same time, the increased thickness of the dielectric sheet and the conductor sheets, made possible by the present invention, permits the capacitor element or layer to be formed as a laminate of existing sheets of conductive material and dielectric material in order to greatly facilitate manufacture of the capacitor element, that is, as a capacitor laminate.

Accordingly, under the concept of borrowed capacitance, the capacitor laminate or combined capacitor laminates in a single PCB has substantially less capacitance than the theoretical capacitance required for (simultaneous) operation of all of the devices. Preferably the capacitor laminate or laminates in a single PCB may have as little as ten percent of the theoretical capacitance required for simultaneous operation of all devices. More preferably, an embodiment of the capacitive PCB was found to be effective with only about two percent of the theoretical capacitance required for simultaneous operation of the devices thereon. Generally, it is assumed that about one square inch of capacitor laminate is available in proportion to each device, at least on a typical PCB.

Thus, in addition to the substantial advantages made possible by the Sisler concept referred to above, the capacitor laminate of the present invention permits the necessary capacitance to be internally formed within the printed circuit board for operation of relatively large numbers of devices and/or integrated circuits.

Additional advantages are also realized by the concept of the present invention. In particular, the borrowed capacitance concept of the invention, employing adjacent capacitor areas, provides a capacitive function resembling a plurality of capacitors associated with each of the devices and/or integrated circuits. This effect has been found to novelly suppress voltage fluctuations and noise over an unexpectedly broad range of frequencies or speeds, particularly relatively high frequencies or speeds.

It has also been found possible to provide additional tuning of the resulting capacitive printed circuit board, for example, by the provision of a limited number of surface capacitors coupled with different areas of the capacitor laminate, in order to effectively suppress voltage fluctuations and noise especially at lower operating speeds and frequencies.

In order to take advantage of the concept of borrowed capacitance as described above, it is accordingly an object of the present invention to provide a capacitive printed circuit board (PCB) with a capacitor laminate included within the multiple layers of the laminated board, a large number of devices such as integrated circuits being mounted or formed on the board and operatively coupled with the capacitor laminate (or multiple capacitor laminates) to provide a capacitive function employing borrowed or shared capacitance as described above.

Each capacitor laminate includes two sheets of conductive material and an intermediate sheet of dielectric material laminated together as a structurally rigid assembly facilitating its inclusion within the printed circuit board. The dielectric material has selected values of thickness and dielectric constant enabling each of the devices or integrated circuit to function in random operation through the concept of borrowed capacitance of the present invention. The sheets of conductive material similarly have a minimum conductance value for permitting adequate current flow necessary to provide each individual device with sufficient borrowed capacitance for its proper operation.

Preferably, in accordance with the Sisler concept, the capacitor laminate is contemplated to include the power and ground planes within the printed circuit board in order to take advantage of design considerations discussed above. In addition, multiple capacitor laminates may be arranged in spaced apart relation within the PCB for further increased capacitance.

It is more specifically an object of the invention to provide such a capacitor laminate with a dielectric sheet having a thickness of at least about 0.5 mils, the sheets of conductive material each having a thickness of at least about 0.5 mils as well in order to assure structural rigidity of the capacitor laminate and to provide sufficient borrowed capacitance for random operation of the devices.

In accordance with the present invention, both the dielectric sheet and the conductive sheets are selected not only on the basis of minimum thickness for structural rigidity but also on the basis of electrical characteristics to assure necessary capacitance as discussed herein. More specifically, the minimum thickness of the dielectric sheet permits the use of state-of-the-art dielectric materials having a dielectric constant of at least about 4. As is discussed in greater detail below, dielectric materials having a dielectric constant in the range of 4 to 5 are readily available and it is possible to form dielectric materials having constants of up to about 10, for example, by forming the dielectric sheets from materials such as ceramic filled epoxies.

At the same time, it is also important as noted above to provide minimum conductance within the conductive sheets in order to assure adequate electron flow or current flow as necessary for the concept of borrowed or shared capacitance of the present invention. In that regard, it is noted that conductance is dependent not only upon the material from which the conductive sheets are formed but also upon the dimensions or more specifically the amount or bulk of conductive material in the sheet. Accordingly, with the conductive sheets being formed from a suitable conductive material such as copper, the dimensions of the sheets are selected in terms of ounces per square foot in order to assure the necessary material for achieving desired conductance. On that basis, a copper sheet having a thickness of at least about 0.5 mils, more specifically a thickness of about 0.6–0.7 mils, normally has about 0.5 ounces of copper per square foot of conductive sheet.

It is therefore preferably contemplated that the capacitor laminate have a dielectric thickness of at least about 0.5 mils as noted above, more preferably about 1.5 mils with a dielectric constant of about 4.0–5.0, most preferably about 4.7. A dielectric sheet formed in accordance with the above limitations can readily be formed from state-of-the-art materials while assuring proper structural rigidity within the sheet.

Similarly, the conductive sheets are formed from conductive material, preferably copper, having a minimum thickness of 0.5 mils (or about 0.5 ounces per square foot) as noted above, the conductive sheets more preferably each having a thickness of about 1 mil (or about 1.0 ounces per square foot) for an overall thickness in the capacitor laminate of about 3.5 mils.

Such a design has been found to take advantage of existing state-of-the-art materials, particularly in the dielectric sheet, while providing structural rigidity in the individual conductive sheets and dielectric sheet as well as in the capacitor laminate to facilitate manufacture of the capacitor laminate as well as manufacture of a capacitive printed circuit board with the capacitor laminate as a layer thereof. As noted above, such a design is made possible through the use of the concept of "borrowed or shared capacitance" which in turn relies upon random operation of the devices.

It is an additional object of the invention to provide a capacitor laminate as described above either as an intermediate product or as a portion of a capacitive printed circuit board. The capacitive printed circuit board contemplated by the present invention may be complete with contemplated devices and/or integrated circuits mounted or formed thereupon. The invention also contemplates capacitive printed circuit boards of similar design but prior to the devices and/or integrated circuits being arranged thereupon.

With relation to the capacitor laminate by itself or laminated singly or in multiple layers with in a printed circuit board (PCB), it is a particular object of the invention to provide the capacitor laminate with enhanced capacitive integrity.

In this regard, the term "capacitive integrity" indicates a desirable characteristic of the capacitor laminate in the form of resistance to generally all types of capacitor failure including shorting between the conductive foils, breakdown of the dielectric resulting from a potential applied between the conductive foils, either during testing or actual use of the capacitor laminate, etc.

More specifically, it is an object of the invention to provide such a desirable capacitor laminate by selecting a dielectric sheet having an initial thickness, prior to lamination, no more than about 4 mils, more preferably no more than about 2 mils and most preferably on the range of approximately 1–1.5 mils, selecting two conductive foils each having one surface treated side with surface roughness or surface variation just sufficient to promote adhesion of the one sides of the conductive foils to the dielectric sheet in a resulting capacitor laminate wherein the one surface treated sides of the conductive foils are in intimate contact with opposite sides of the dielectric sheet wherein by the dielectric sheet has a minimum thickness between all opposing surface portions of the conductive foils for enhanced capacitive integrity.

The surface treatment of the conductive foils in the capacitor laminate has particular value in a number of applications. Specifically in connection with the preferred embodiments of the present invention, the invention provides desired capacitive integrity where the capacitor laminate is contemplated for use in capacitive printed circuit boards where the concept of borrowed or shared capacitance is employed in able to permit or facilitate operation of large numbers of devices mounted upon the PCB and coupled to different portions of the capacitor laminate. In such embodiments, it is necessary to limit the thickness of the dielectric sheet in order to provide necessary capacitance as described in greater detail hereinbelow. For such applications, it is contemplated that the capacitor laminate include a dielectric sheet having commonly available dielectric capabilities and a thickness of not more than about 2 mils, most preferably in the range of about 1-1.5 mils.

Heretofore, it has not been considered practicable to employ such thin dielectric sheets in capacitor laminates because of the substantial surface roughness or surface variations or "tooth" commonly provided upon the conductive foils to assure their proper adhesion both within the capacitor laminate and/or within a PCB, particularly a capacitive PCB as described above.

Where the capacitor laminate is contemplated for use either as a single or multiple layers within a capacitive PCB based on the theory of shared or borrowed capacitance ad noted above, it is also necessary to provide a minimum level of conductivity within the conductive foils as discussed elsewhere herein.

Preferably, both surfaces of each dielectric foil are similarly surface treated to assure proper adhesion or bonding both within the capacitor laminate and within a laminated capacitive PCB, for example. Such applications can readily be met by employing commonly available conductive foil formed by well known electrodeposition technique so that the resulting conductive foil, usually copper, has a "barrel" side which may also be referred to as a "smooth" side or "shiny" side. The other side of the conductive foil is commonly referred to as the "matte" side but is also known as the "tooth" side and is generally characterized by greater surface roughness or surface variation than on the barrel side of the foil. Certain grades of such conductive foil have been found suitable for use within the present invention by reversing the orientation of the conductive from that employed in the prior so that the barrel or smooth side with relatively less surface roughness or surface variation is laminated into intimate contact with the dielectric sheet.

However, such a configuration requires indexing of the conductive foils to assure their proper orientation with respect to the dielectric sheet. By contrast, the present invention also contemplates a conductive foil wherein both surfaces of the conductive foil have similar degrees of surface roughness or surface variation so that the indexing step would not be necessary during lamination of the capacitor laminate.

Similarly, it is a related object of the invention to provide methods of manufacture for the capacitor laminate itself and for the capacitive printed circuit board in the forms discussed above.

Additional objects and advantages of the invention are made apparent in the following description having reference to the accompanying drawings.

DESCRIPTION OF THE PREFERRED EMBODIMENT

A capacitor laminate constructed according to the present invention is described in greater detail below. The capacitor laminate may be used, for example, as a capacitive layer in a printed circuit board according to the Sisler concept described above. Different embodiments of PCBs are also described below as necessary to facilitate an understanding of the function for the capacitor laminate of the invention.

As noted above, it is particularly important to understand that the capacitor laminate of the present invention is designed to facilitate simple manufacture, preferably by lamination of existing separate sheets of a central dielectric sheet of material and conductive sheets on opposite sides thereof, both the dielectric material and conductive material being selected according to the existing state-of-the-art. Such a combination has been made possible by the concept of borrowed or shared capacitance as was also summarized above.

The concept of borrowed capacitance permits the use of such state-of-the-art materials in a capacitor laminate having relatively substantial dimensions, that is, corresponding to the dimensions of the PCB, the capacitor laminate having sufficient thickness for realizing structural rigidity of the individual dielectric and conductive sheets of the capacitor laminate as well as for the assembled capacitor laminate. As was discussed in greater detail above, the theory of borrowed capacitance avoided the limitation of allotting a specific portion of the capacitive area to each device. Rather, both the dimensions and electrical characteristics for the capacitor laminate of the invention are selected so that each device employs not only a proportional capacitive area but also adjacent capacitive areas proportional or allotted to different devices. Such a mode of operation was made possible based upon the realization that the devices on a given printed circuit board operate randomly. Thus, since a selected device is operating independently of adjacent devices, it is allowed to make use of a greater proportion of the capacitive area in the capacitor laminate through the concept of borrowed or shared capacitance. The analogy to freeway traffic, set forth above, is again noted to further explain and illustrate this concept.

It is also important to distinguish the concept of borrowed or shared capacitance as set forth in the present invention in contrast to a more traditional concept of distributed capacitance commonly employed, for example, in the analysis of power transmission lines. This theory of distributive capacitance is believed to be well known to those skilled in the art of printed circuit board design and involves the calculation of distributed capacitance based upon the formula:

$$C = eA/t$$

where C equals capacitance in microfarads, e equals the dielectric constant or relative permittivity of the dielectric material, A equals the available or assigned area of the capacitive device and t equals the thickness of the dielectric layer.

Using this formula, the required thickness of a dielectric layer using standard printed circuit materials and yielding a calculated value for a common bypass capacitor (0.1 microfarads) per square inch results in a nominal thickness of about 0.000021 (inches) of dielectric layer in a capacitive layer for a printed circuit board employing two separate capacitive layers in its design. This dielectric thickness is obviously not producible from state-of-the-art materials or manufacturing techniques for PCBs at the present time. More specifically, the above design calculations are believed representative of capacitive materials originally considered necessary for carrying out the Sisler concept and would have required a dielectric layer with a thickness 100 times small than is presently feasible or with a dielectric constant about 100 times greater than is presently available in the state-of-the-art.

Thus, the capacitor laminate construction described in detail below and made possible by the concept of borrowed or shared capacitance permits the inherent advantages of the capacitive printed circuit board design of the Sisler concept to be constructed employing the capacitor laminate of the present invention using existing state-of-the-art materials with dimensions or thicknesses of the dielectric material and conductive material readily facilitating manufacture not only of the capacitor laminate but also of capacitive printed circuit boards including the capacitor laminate.

In addition to facilitating manufacture of the capacitive printed circuit board at relatively low cost and with greatly enhanced reliability, the present invention has also been found to permit improved response of large numbers of devices provided with capacitance by the capacitor laminate of the invention. The capacitor laminate of the invention has also been found to permit precise voltage regulation and noise reduction over broad frequency ranges for the devices. In addition to providing such regulation at relatively high frequencies, it has also been found possible to achieve similar voltage regulation and noise reduction at lower frequencies, for example 40 megahertz, by tuning wherein limited numbers of surface capacitors are interconnected with the capacitor laminate as described in greater detail below.

The capacitor laminate of the invention and different embodiments of capacitive printed circuit boards employing the capacitor laminate are described below. In the following description, materials and design considerations are first set forth for the capacitor laminate including a central sheet of dielectric material and sheets of conductive material arranged on opposite side thereof. Thereafter, general considerations for employing the capacitor laminate within a capacitive printed circuit board are set forth including design considerations for various types of printed circuit boards.

The mode of operation for such capacitive PCBs including the capacitor laminate are then set forth followed by a brief discussion of manufacturing techniques for both the capacitor laminate and the capacitive PCBs. In connection with the manufacturing techniques, it is to be kept in mind that it is a specific purpose of the present invention to permit the use of relatively conventional materials and manufacturing techniques both for the capacitor laminate and for the capacitive PCB as made possible by the concept of borrowed or shared capacitance discussed above.

The capacitor laminate and various features of a capacitive printed circuit board illustrated in the drawings are discussed in greater detail below following a discussion of specific materials employed within the capacitor laminate. However, components in the drawings are briefly described at this point in order to assure better understanding of the components discussed immediately below in terms of selection of material and electrical characteristics as well as their dimensions, particularly within the capacitor laminate.

Figure 1:
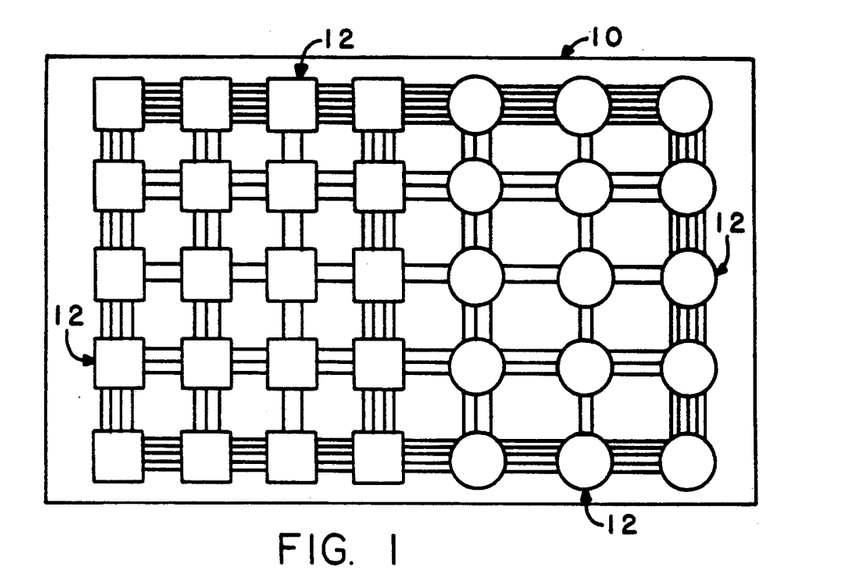
FIG. 1 is a plan view of a capacitive printed circuit board constructed according to the present invention.

Referring initially to FIG. 1, a capacitive PCB constructed according to the present invention is generally indicated at 10. The printed circuit board 10 is of generally conventional construction except for the provision of an internal capacitor laminate as described in greater detail below. Accordingly, external features of the capacitive printed circuit board 10 are only briefly noted, the architecture and design considerations for the printed circuit board otherwise being generally of a type well known to those skilled in the art.

For purposes of the present invention, it is sufficient to understand that the capacitive PCB 10 is of a type including large numbers of devices 12 arranged upon its surfaces. In accordance with well known printed circuit board technology, the devices or components may be arranged upon one or both sides of the board and may include both active devices such as integrated circuits, transistors, etc. Such active devices may even include components such as vacuum tubes or the like. The devices 12 may also include passive devices such as capacitors, resistors, inductors, etc.

In the design of PCBs such as that illustrated at 10, it is common practice to employ a power source described and illustrated in greater detail below which is embodied by power and ground planes or conductors formed as laminates in the printed circuit board itself. A variety of configurations are provided for mounting the devices upon the PCB and for interconnecting them both with the power source and each other. Although such design considerations are generally beyond the scope of the present invention, two such configurations are described below with reference to FIGS. 2 and 3.

Figure 2:
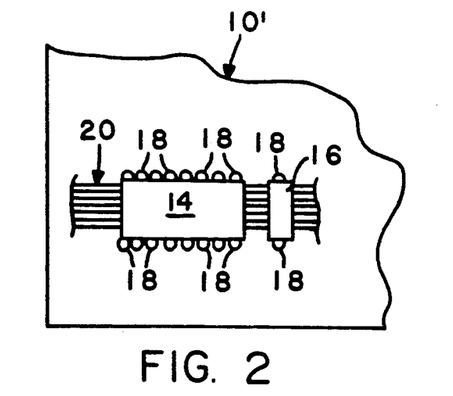
FIG. 2 is an enlarged fragmentary view of a portion of the printed circuit board showing a device such as an integrated circuit mounted on the surface of the printed circuit board and connected with other devices or components and a power source in the board by throughhole connections.

Referring to FIG. 2, an active device such as integrated circuit is indicated at 14 with a passive device, specifically a capacitor being generally indicated at 16. These devices, particularly the active device or integrated circuit 14, are representative of large numbers of devices arranged upon the printed circuit board as generally indicated in FIG. 1. In a configuration of the type illustrated in FIG. 2, the devices are interconnected to power and ground planes within the printed circuit board and to other devices by through-hole connectors or pins generally indicated at 18. In FIG. 2, two such connectors or pins 18 are illustrated for the capacitor 16 while the integrated circuit 14 is of a 16-pin design including 16 through-hole connectors or pins 18 as illustrated. Additional traces may be provided as generally indicated at 20 for facilitating interconnection of the various devices upon the printed circuit board.

Figure 3:
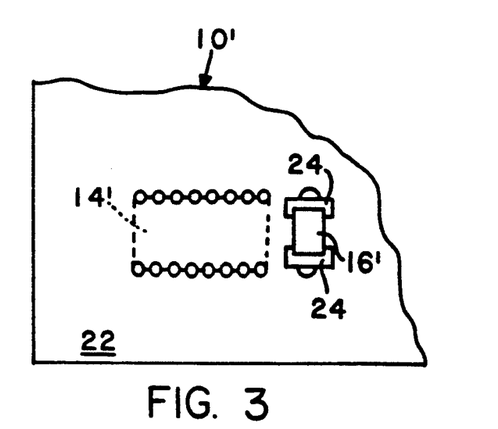
FIG. 3 is a view similar to FIG. 2 while illustrating a surface mounted device arranged upon the surface of the printed circuit board and connected with other devices or components and a power source in the printed circuit board by surface traces or pads.

Another configuration for a printed circuit board is indicated by the fragmentary representation of FIG. 3 which similarly illustrates an active device such as an integrated circuit being generally indicated at 14' and illustrated in phantom since it is mounted on the opposite or top surface of the circuit board from the bottom surface illustrated in FIG. 3. A passive device or capacitor 16' is also illustrated in FIG. 3 preferably mounted on the bottom surface 22 of the printed circuit board. In the surface mounted configuration of FIG. 3, both the active device 14' and the capacitor 16' are mounted upon surface traces or pads 24. In accordance with well known techniques in the printed circuit board technology, the pads 24 facilitate surface mounting of the devices while providing for interconnection of the devices with each other and with a power source such as the internal power and ground planes referred to above by both surface traces and through-hole connectors or pins where necessary.

With reference to both FIGS. 2 and 3, the present invention particularly contemplates the use of an internal capacitive layer in the form of the capacitor laminate of the present invention in order to replace large numbers of surface capacitors. Accordingly, although most of the surface capacitors are replaced in the printed circuit board 10 by the capacitor laminate of the invention, a limited number of surface capacitors may still be desirable as illustrated in FIGS. 2 and 3, at least for the purpose of achieving low frequency tuning as discussed in greater detail below.

FIG. 3 is a sectional view of the capacitive PCB 10 of FIG. 1 and illustrates a capacitor laminate 26 constructed according to the present invention and forming an internal capacitive layer within the printed circuit board 10. The capacitor laminate 26 includes spaced apart sheets 28 and 30 formed from conductive material, preferably copper, and arranged on opposite sides of a dielectric sheet 32. Preferably, the conductive sheets 28 and 30 form the power and ground planes for the printed circuit board. Such a configuration, specifically in terms of the power and ground planes, is well known in the art and no further discussion in that regard is believed necessary. However, the Sisler concept novelly combines the function of the conductive sheets 28 and 30 for the capacitive layer or capacitor laminate 26 with the power and ground planes to greatly simplify manufacture of the printed circuit board at reduced cost and with greatly increased reliability. A surface mounted device 14', corresponding to the integrated circuit of FIG. 2, is mounted on the surface of the board in FIG. 4 and is interconnected with the conductive sheets 28 and 30 by respective power and ground leads 34 and 36. The power lead 34 is connected with the conductive sheet 28 while a hole (not shown) is formed in the other conductive sheet 30. Similarly, the ground lead 36 passes through a hole in the conductive sheet 28 while being electrically coupled with the conductive sheet 30. In this manner, the surface device 14' is properly connected with both the power and ground planes. Signal traces such as that indicated at 38 are also provided for interconnecting the devices or for making other connections within the PCB as necessary.

Figure 4:
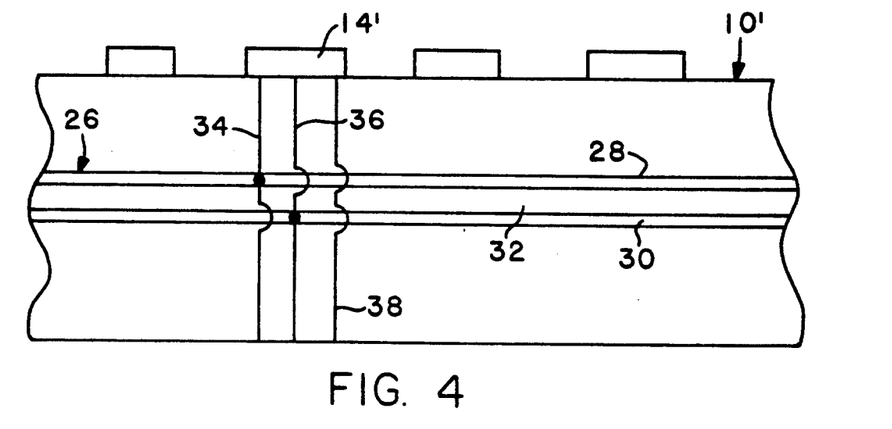
FIG. 4 is a schematic sectional view of the printed circuit board illustrating connections or traces for a representative device to power and ground planes formed by a capacitor laminate within the printed circuit board according to the present invention.
Figure 5:
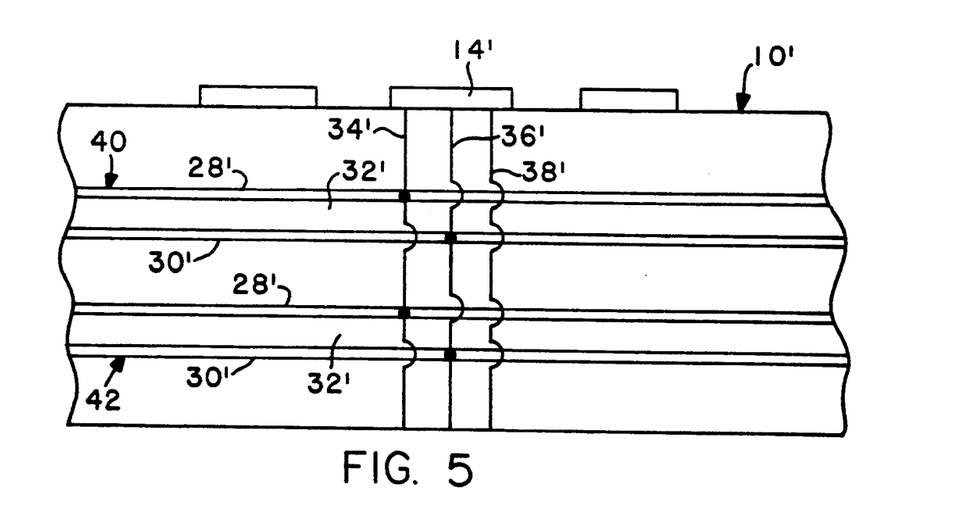
FIG. 5 is a similar schematic sectional view as FIG. 4 while illustrating multiple capacitor laminates within the printed circuit board.

Referring to FIG. 5, another embodiment of a capacitive printed circuit board 10' is illustrated which includes two capacitor laminates 40 and 42. The capacitor laminates 40 and 42 are of similar construction as the capacitor laminate 26 of FIG. 4 except that the capacitor laminates 40 and 42 are arranged in spaced apart relation through the cross section of the printed circuit board to permit them to be insulated one from the other. In addition, a surface mounted device again illustrated at 14' is interconnected with the conductive sheets 28' and 30' by power and ground leads respectively indicated at 34' and 36'. The power and ground leads 34' and 36' are connected in parallel with the capacitor laminates 40 and 42. In other words, the power lead 34' is connected with the conductive sheet 28' in each of the capacitor laminates 40 and 42 while passing through holes in the other conductive sheets 30'. Similarly, the ground lead 36' is electrically interconnected with both of the conductive sheets 30' while passing through holes in the conductive sheets 28'.

In this manner, the two capacitive layers (or capacitor laminates) provided in FIG. 5 provide double the capacitance of the single capacitive layer in FIG. 4, assuming that the overall areas for the capacitor laminates are equal. In addition, because of the parallel connections with the conductive sheets forming the power and ground planes in FIG. 5, the power and ground planes are effectively provided with twice the amount of conductive material. Accordingly, the design of FIG. 5 may be employed not only where larger amounts of capacitance is desired but also in higher voltage applications and the like where the power and ground planes are contemplated for carrying either higher current or withstanding larger voltage differentials therebetween.

Figure 6:
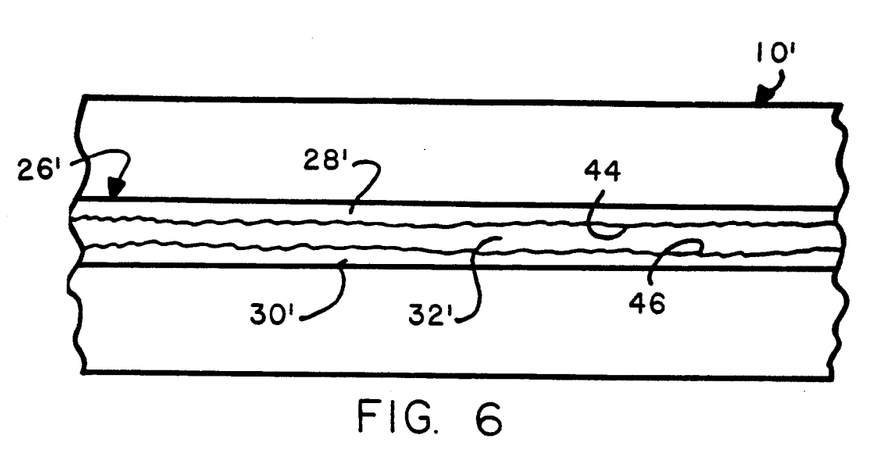
FIG. 6 is a photomicrograph of a cross-sectional portion of a capacitive printed circuit board including a capacitor laminate according to the invention.

As noted above, FIG. 6 is a photomicrograph in cross section of the capacitive printed circuit board 10 of FIG. 1 and is intended to illustrate particular features of the capacitor laminate 26 as discussed in greater detail below.

Based upon the features of a capacitor laminate such as that indicated at 26 in FIG. 4 and an capacitive printed circuit board such as that illustrated at 10 in FIG. 1, the individual components of the capacitor laminate are discussed in detail below since they are particularly important to the invention.

Initially, the capacitor laminate 26 is designed to provide necessary capacitance for all or a substantial number of devices mounted upon the surface of the printed circuit board 10. Those devices may be interconnected with the power and ground planes either by separate through-hole pins or by surface traces of the type illustrated respectively in FIGS. 2 and 3.

As noted above, the capacitor laminate 26 is designed to take advantage of the concept of borrowed or shared capacitance so that the capacitor laminate as well as its respective sheets of conductive and dielectric material may be structurally rigid or, in other words, generally self supporting in order to facilitate manufacture of the capacitor laminate, preferably by lamination of separate sheets, and also to facilitate manufacture of the printed circuit board 10 with one or more capacitor laminates of the type illustrated at 26 as internal components therein. See FIGS. 4 and 5. In order to achieve the concept of borrowed capacitance, the sheet of dielectric material 32 has selected values of thickness and dielectric constant whereby each individual device mounted upon the surface of the printed circuit board is provided with a capacitive function by an allotted portion of the capacitor laminate and also by borrowed capacitance from surrounding portions of the capacitor laminate. Accordingly, as noted above, the capacitive function of the capacitor laminate is dependent upon random firing or operation of the devices since the capacitor laminate 26 provides total capacitance equal to only a portion of the capacitive value necessary for the complete array of devices upon the printed circuit board.

At the same time, the conductive sheets 28 and 30 are provided with sufficient conductive material, either in terms of mass per unit area or in terms of thickness, in order to permit adequate electron flow or current flow necessary to provide each individual device with sufficient borrowed capacitance for its proper operation.

In carrying out these functions, the conductive sheets may be formed from any of a variety of conductive metals such as aluminum, silver, gold and the like. However, the conductive sheets are preferably formed from copper because of its superior conductive characteristics compared to all other non-precious metals.

As was also discussed above, each of the conductive sheets 28 and 30 is formed with a sufficient mass of copper per unit area in order to achieve structural rigidity as noted above and also to permit sufficient electron flow or current flow in accordance with the concept of borrowed capacitance. More specifically, it is contemplated that each of the conductive sheets 28 and 30 be formed with at least about 0.5 ounces of copper per square foot, that mass corresponding generally to a thickness of about 0.5 mils, more specifically about 0.6–0.7 mils. The thickness of the conductive sheets may be increased, for example, in order to meet larger voltage or current carrying capacities for the power and ground planes in a particular application. Preferably, each of the conductive sheets includes about 1–2 ounces of copper per square foot, those masses corresponding to thicknesses for the individual sheets in the range of about 1.2–2.4 mils. More preferably, the conductive sheets 28 and 30 are formed with about one ounce of copper per square foot or having a thickness in the range of about 1.2–1.4 mils to achieve optimum performance of the capacitor laminate 26. That amount of copper in each of the conductive sheets is also selected as a minimum for achieving good structural rigidity within the conductive sheets 28 and 30 alone prior to their lamination into the capacitive laminate 26.

It is again noted that applications requiring large voltage or current capacities in the conductive sheets 28–30 may be provided by relatively lesser amounts of copper where multiple capacitive layers or capacitive laminates are provided in each respective printed circuit board (see FIG. 5).

The composition and thickness of the dielectric sheet 32, either in the single capacitor laminate 26 of FIG. 4 or in multiple capacitor laminates as illustrated in FIG. 5, are selected to achieve necessary capacitance, again in accordance with the concept of borrowed capacitance, and also to achieve structural rigidity for the dielectric sheet 32, both by itself prior to inclusion within the capacitor laminate 26 as well as for the composite capacitive laminate.

Electrical performance of the dielectric sheet 32 is dependent upon its conductance which, in accordance with well known principles, is a reciprocal of resistance measured by the ratio of current flowing through a conductor to the difference of potential between conductive pins or elements. In any event, conductance is dependent on both the dielectric constant of the material and also dimensional thickness of the dielectric sheet. In many present state-of-the-art applications, there is a desire for reduced dielectric constant in order to permit the use of thinner dielectric films. In this regard, the present invention is contrary to such other capacitor developments in that a larger capacitance is desired in order to permit the use of a relatively thicker dielectric sheet having structural rigidity as noted above.

Accordingly, the present invention preferably contemplates the use of dielectric material having a dielectric constant of at least about 4. A range of dielectric materials widely available in the present state-of-the-art having dielectric constants in the range of about 4–5. Furthermore, it is possible to formulate dielectric compositions, for example, from ceramic filled epoxies, with dielectric constants ranging up toward 10 for example. Thus, the present invention preferably contemplates use of a material with a dielectric constant of at least about 4, more preferably within a range of about 4–5 and most preferably about 4.7, at least for the specific composition contemplated in the preferred embodiment.

Such a preferred dielectric constant can be achieved by combinations of a woven component and a resin component combined together to form the necessary combination of dielectric constant and structural rigidity. The woven component may include polymers such as polytetra fluoroethylene (available under the trade names TEFLON and GORETEX) and epoxies. However, the woven components are preferably formed from glass which may be of a quartz variety but is preferably silica, the glass being formed in threads which are then woven together to form sheets filled or impregnated with a selected resin. The resins are commonly selected for fire retardant characteristics and may include materials such as cyanate esters, polyimides, kapton materials and other known dielectric materials. However, the resin is preferably an epoxy, again in order to take advantage of the existing state-of-the-art regarding use of such resins in PCB manufacture.

A dielectric sheet formed from a single woven layer of glass and about 70.0% by weight resin has the preferred dielectric constant of 4.7 as noted above while also exhibiting good structural rigidity at a thickness of about 1.5 mils.

The thickness of the dielectric material in the present invention is selected not only to achieve the desired capacitance but also to assure electrical integrity, particularly the prevention of shorts developing between the conductive sheets 28 and 30 in the capacitor laminate 26. Common practice contemplates treatment of the surfaces of the conductive sheets adjacent the dielectric sheet in order to enhance adhesion within the capacitor laminate 26. Such adhesion is necessary not only for structural integrity but also to assure proper electrical performance. Typically the adjacent surfaces 44 and 46 of the conductive sheets 28 and 30 respectively are treated typically by deposition of zinc or zinc and copper (a brass alloy), usually by plating, in order to form roughened surfaces best illustrated in the photomicrograph of FIG. 6. These roughened surfaces provide "tooth" to enhance mechanical bonding to the dielectric material in the sheet 32.

It has been found that a capacitor laminate constructed from conductive and dielectric materials in accordance with the preceding discussion is particularly suitable for forming the capacitor laminate of the present invention while facilitating manufacture at low cost with high reliability, both in the capacitor laminate and the capacitive printed circuit board, while also providing good structural rigidity and at the same time permitting the use of existing state-of-the-art materials.

Based upon those same considerations, a capacitor laminate can be constructed according to the present invention as embodied in the capacitor laminate indicated 26. Because of the structural rigidity provided in the capacitor laminate, it can readily be produced as an intermediate product and delivered to a variety of sites for inclusion in a capacitive printed circuit board such as that indicated at 10 in FIG. 1.

Because of the same considerations in the invention, such a capacitive printed circuit board can be manufactured using existing technology except for the inclusion of the novel capacitor laminate as an internal component therein. The PCB may be produced as an intermediate product ready to receive surface mounted devices and the like or completed with the devices mounted thereon and ready for use in a variety of applications.

In operation, both the capacitor laminate and a capacitive PCB constructed therefrom are designed with various characteristics, particularly electrical characteristics including capacitance in accordance with the present invention for satisfying the requirements of a variety of applications. Specifically, the capacitor laminate is formed with total capacitance admittedly less than the total capacitance necessary for simultaneous operation of all of the devices on a PCB, at least under optimum conditions. This is made possible through the concept of borrowed capacitance which permits the devices to draw on the necessary capacitive value from the capacitor laminate because of the concept of borrowed capacitance and because of the random operation of the devices.

The ability of the capacitor laminate constructed according to the present invention to perform its intended function within a capacitive PCB has been found to further illustrate advantages of the concept of borrowed capacitance in that the thickness of the dielectric sheet 32 can be varied as much as ±10% without affecting the capacitive response of the devices mounted upon the board. Such a characteristic is believed to clearly demonstrate that the devices are not functioning purely based upon capacitance in a proportional or allotted amount of the capacitant area. Rather, it is believe that this ability to operate with substantial variation in dielectric thickness indicates an ability of the devices to borrow the amount of capacitance necessary for operation in a given application. In any event, this phenomenon, although possibly not fully understood, is believed to further enhance design variations within the invention.

It is also noted that theoretical considerations discussed immediately above and elsewhere in the present discussion are intended to provide a more complete understanding of the invention. However, it is to be understood that operation of the invention may be dependent upon phenomena or other design considerations different from or even contrary to those set forth above. However, the capacitor laminate constructed in accordance with the present invention has been found to function novelly for all of the reasons set forth above, regardless of the theoretical basis therefor.

In manufacture, the dielectric sheet and conductive sheets are selected in accordance with the preceding discussion for the capacitor laminate. With the conductive sheets being formed preferably from one ounce copper having standard treatment on the adjacent surfaces 44 and 46 as noted above and the dielectric sheet being selected in accordance with the most preferred embodiment above, those three sheets as separate structurally rigid entities are combined in the proper order and configuration and laminated together. The various layers of the capacitor laminate are then assembled and laminated at 300 pounds per square inch pressure at a temperature of about 350° F. for about one hour. Steel separators are preferably employed adjacent opposite surfaces of the capacitor laminates in order to assure smooth surfaces thereon for facilitating their inclusion in a printed circuit board.

Thereafter, the capacitor laminate may be included as laminations or layers with one or more of the capacitor laminates being included in the printed circuit board according to its intended application. The printed circuit board may be fabricated according to existing state-of-the-art technology except for the inclusion of the novel capacitor laminate of the invention.

Another aspect of the invention concerning surface treatment or surface characteristics in a capacitor laminate to achieve relatively high capacitance with enhanced capacitive integrity is discussed immediately below with respect to the prior art representation of FIG. 7 and a similar photomicrograph in cross section of a capacitor laminate constructed according to the present invention.

Figure 7:
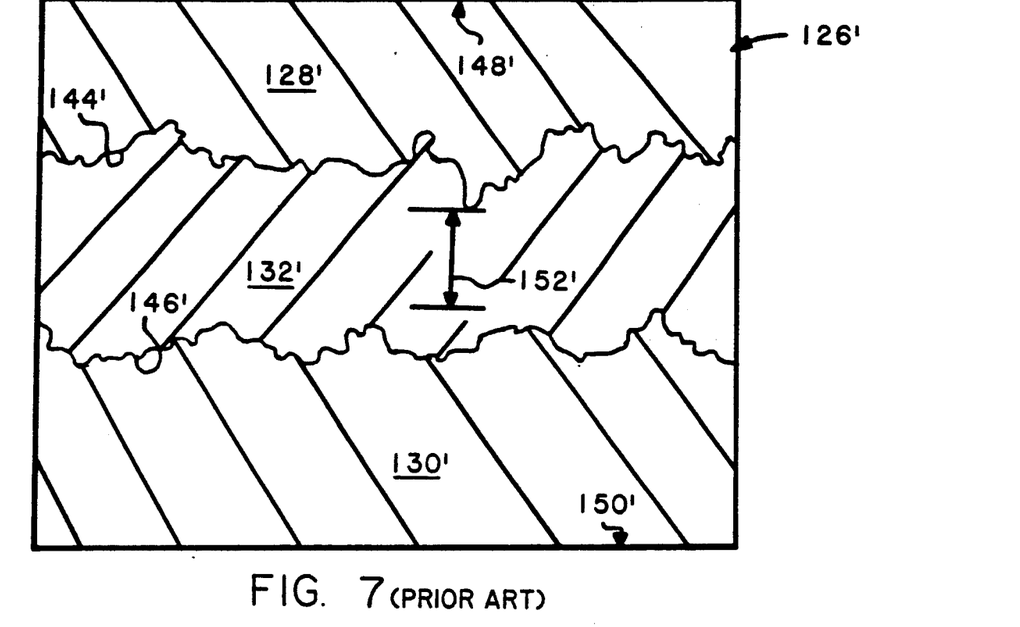
FIG. 7 is a prior art representation in the form of a photomicrograph in cross section of a capacitor laminate wherein the matte or tooth sides of two conductive foils are positioned adjacent opposite sides of a dielectric sheet to have a minimum thickness or spacing between all opposing surface portions of the conductive foils of 3.5 mils.

Referring initially to FIG. 7, a prior art capacitor laminate is generally indicated at 126' while including a single dielectric sheet 132' with conductive foils 128' and 130' laminated to opposite sides of the dielectric sheet 132'.

In accordance with standard practice, each of the conductive foils 128' and 130' had their matte or tooth sides 144' and 146' in intimate contact with the dielectric sheet 132'. The barrel or smooth sides 148' and 150' respectively for the conductive foils faced outwardly or away from the dielectric sheet. Such an arrangement was employed in order to maximize adhesion between the two conductive foils and the dielectric sheet.

The military specification referred to above has been commonly considered a standard for such prior art capacitors. Among other requirements, the military specification have required that the capacitor withstand a potential of 750 volts per mil of dielectric thickness being applied between the conductive foils. In other words, it was necessary that the capacitor not exhibit either direct shorting between the conductive foils, dielectric breakdown or failure, etc. Furthermore, the military specification required that the dielectric sheet, after being laminated between the conductive foils, have a minimum thickness between any opposing surface portions of the conductive foils of at least 3.5 mils. That minimum thickness is generally indicated in the prior art representation of FIG. 7 at 152'. In meeting that minimum thickness requirement, it was common practice to employ a dielectric sheet having an initial thickness of as much as 5-6 mils. That initial thickness for the dielectric sheet was required because of the substantial surface roughness or surface variation on the matte side of the foil, as indicated at 144' and 146' in FIG. 7.

The use of such thick sheets of dielectric material generally limited the capacitance of the resulting capacitor laminate while assuring that it would withstand the imposition of relatively large voltages or potentials as noted above. At the same time, many commercial applications for such capacitors, including personal computer components, business computers, etc. contemplate imposition of, at most, about five to fifteen volts so that, in such applications, it is not necessary to withstand potentials on the order of 750 volts per mil.

Conductive foils such as those indicated at 128' and 130' are commercially supplied by a number of sources including Gould Electronics and Texas Instruments. Conductive foils formed from copper are available from Gould under the trade name "JTC" FOIL as described in Gould Bulletin 88401 published by Gould, Inc., Eastlake, Ohio in March 1989. Other foils available from Gould include those available under the trade names LOW PROFILE "JTC" FOIL and "TC/TC" DOUBLE TREATED COPPER FOIL as described respectively in Bulletin 88406 and Bulletin 88405, both published in March 1989 by Gould, Inc. Those bulletins are incorporated herein in order to provide complete information concerning conductive foils such as those noted above.

Surface roughness or surface variation of conductive foil such as those noted above is conventionally indicated by foil surface profile measurements, commonly termed $R_a$ and $R_{tm}$. Those values respectively indicate the surface roughness or surface variation for the foil after initial surface treatment by etching and also following further surface treatment in the form of an oxide layer or coating formed from an alloy of copper and zinc. The profile measurements $R_a$ and $R_{tm}$ are indicated in microns and, for the matte side of the foil, typically range from about 8.0-12.0 microns for the double treated foil referred to above. The so-called low profile "JTC" foil typically has a maximum profile measurement in the range of about 6.0-9.0 microns on its matte side. Generally, for purposes of the present invention, it is assumed that the maximum surface profile value, that is, up to about 12.0 microns, tends to indicate the maximum penetration of "teeth" on the matte side of the foil into the dielectric sheet during lamination. Such a configuration is indicated in FIG. 7. In any event, it is this substantial surface variation for the matte sides of the conductive foils which made necessary the use of dielectric sheets with initial thicknesses of as great as 5-6 mils in order to assure minimum spacing of 3.5 mils as described above.

By contrast to the prior art capacitor laminate represented in FIG. 7, the present invention particularly contemplates capacitor laminates adapted for use in capacitive printed circuit boards with the dielectric sheet of the capacitor laminate having a relative limited thickness in order to achieve a distributed capacitance greater than about 0.1 microfarad. To achieve that value, the present invention preferably contemplates a capacitor laminate which, in its finally laminated form, has a minimum thickness for the dielectric sheet of about 0.75-1.0 mils. At the same time, it was found impracticable to employ conductive foils with surface variations such as those described above being laminated in intimate contact with the dielectric sheet. Generally, it may be seen that with surface variations of up to about 12 microns, on both sides of the dielectric sheet, the resulting minimum thickness of the dielectric sheet, after lamination and in accordance with the above definition, could be reduced by as much as about 1 mil from the initial dielectric thickness.

Furthermore, in developing the preferred embodiment of a capacitor laminate as described elsewhere herein, the capacitor laminate was subjected to testing generally in accordance with the military specification noted above. In other words, assuming a dielectric thickness of about 1-1.5 mils, the capacitor laminates were subjected to a potential of at least 500 volts and as much as 750 volts or 1,000 volts, such testing being carried out to determine the resulting existence of shorts or dielectric failure.

In order to achieve general reliability in such a capacitor laminate, it was found necessary to limit the surface roughness or surface variation on the side of the conductive foil laminated to the dielectric sheet only approximately that amount required to assure adhesion between the conductive foil and the dielectric. It was further discovered that surface variation of the amount on the matte side of the conductive foils described above was not necessary for assuring such adhesion. Although the precise limits of surface variation sufficient for just achieving adhesion are not known, it is known from testing that such adhesion can be achieved with a maximum surface roughness or surface variation corresponding to an R value of no more than about 6 microns, more preferably about 4 microns. These values correspond to the surface characteristics for the foils noted above. More particularly, it was found that good adhesion could be achieved both between the conductive foils and the dielectric sheet as well as between the conductive foils and other layers in a capacitive printed circuit board as described herein and illustrated in FIG. 7 as well as FIGS. 1 and 4-6 by employing the so-called "TC/TC" double treated copper foil described in Gould Bulletin 88405.

In employing that double treated foil according to the present invention, it was found to be critically important to position the drum or smooth side of the conductive foil against the dielectric sheet with the rough side or matte side of the conductive foil facing outwardly. This is of course in direct contrast to what has been practiced in the prior art as noted above. However, with such an arrangement, a capacitor laminate constructed according to the present invention limits the surface roughness or surface variation of the conductive foil abutting the dielectric sheet as noted above. It is noted once again that the double treated copper foil described in Gould Bulletin 88405 has a maximum R value of approximately 4.0 microns on its drum or smooth side with a maximum R value of about 8.0-12.0 microns on its matte side or rough side.

The greater surface roughness or surface variation on the matte side of the conductive foils similarly assures adhesion of the conductive foils to adjacent dielectric or prepreg layers of the printed circuit board. However, since those layers are of substantially greater thickness than the dielectric sheet in the capacitor laminate, the increased surface roughness or surface variation does not present a similar problem.

Figure 8:
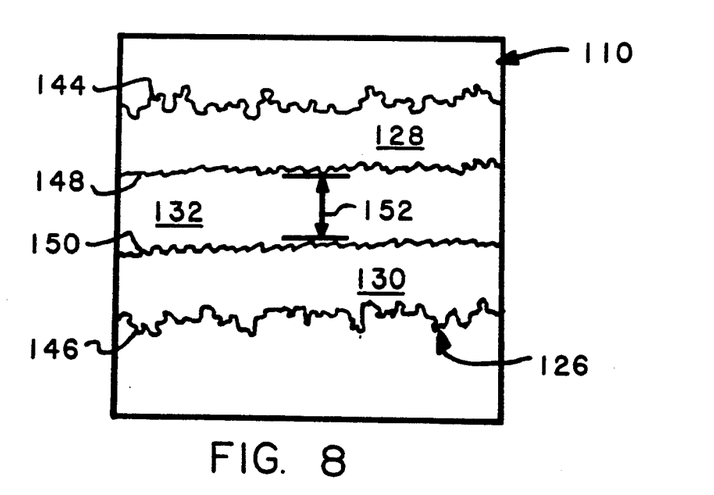
FIG. 8 is a similar photomicrograph in cross section of a capacitor laminate constructed according to the present invention in order to maintain enhanced capacitive integrity as discussed elsewhere herein.

When employing the double treated foil discussed above, it is further necessary to index the conductive foil in order to assure that the drum side or smooth side, indicated at 148 and 150 in FIG. 8, is positioned in contact with the dielectric sheet 132. Ideally, the present invention contemplates a conductive foil having similar surface roughness or surface variations on both sides in accordance with the preferred conditions set forth above for the drum side or smooth side. In other words, the present invention preferably contemplates the use of a conductive foil having a maximum R value of about 6.0 microns and more preferably about 4 microns on both surfaces. The provision of similar surface characteristics on both sides of the conductive foil would eliminate the need for the indexing step referred to immediately above.

It is also to be noted that a capacitor laminate constructed according to the present invention could be employed in other applications than the specific capacitive printed circuit board which is a feature of the present invention. For example, as noted above, it would be possible to meet the above military specification with an initial maximum thickness of dielectric of no more than about 4 mils. This would permit manufacture of a resulting capacitor laminate having a minimum thickness of about 3.5 mils with greater uniformity in the dielectric and without the substantial amount of dielectric which was present with an initial thickness for example of about 5-6 mils.

However, the capacitor laminate having the preferred surface treatment or surface characteristics as noted above is preferably contemplated for use in a capacitive printed circuit board while enabling the capacitor laminate to function under the theory of borrowed or shared capacitance in order to satisfy capacitance requirements for large numbers of devices mounted upon the PCB.

Thus, in summary, the capacitor laminate preferably employs a dielectric sheet having an initial thickness of no more than about 4 mils, preferably no more than about 2 mils and most preferably in the range of about 1-1.5 mils. Conductive foils employed in capacitor laminates for a capacitive PCB preferably have conductivity equivalent to a thickness of at least about 1 mil of copper. Preferably, it is contemplated that the conductive foils be formed with about 1 ounce of copper per square foot, the resulting thickness of the conductive foil being about 1.2-1.4 mils.

In addition, the conductive foils are surface treated, preferably upon both sides and at least upon one side arranged adjacent the dielectric sheet with a maximum surface roughness or surface variation corresponding to an R value of about 6.0 microns, preferably about 4.0 microns.

Assuming that the surface profile indicated by the R value tends to correspond to maximum penetration of teeth on the conductive film into the dielectric sheet, it is further noted that combined penetration for two conductive foils having maximum surface variation of about 6 microns would correspond to a combined penetration of about 12 microns or approximately 0.5 mil. Thus, with the initial dielectric thickness of 1.5 mils for example, this would result in a minimum thickness of about 1.0 mils. It is believed that good capacitive integrity can be maintained for the capacitor laminate with such a minimum thickness of about 1.0 mil, possibly as low as 0.75 mils and probably no less than about 0.5 mils. Thus, the invention contemplates a dielectric sheet having a minimum thickness of about 0.75-1.25 mils.

In conclusion concerning the capacitor laminate as described above, the numerical values and ranges defined for both the dielectric sheet and the conductive foils are based upon initial testing which is believed sufficient to establish the general ranges of values as described herein. However, since testing was not exhaustive, it is to be noted that certain variations may be possible in those values. In particular, it is possible that preferred or adequate adhesion may be achieved with a surface roughness or surface variation even less than the minimum R value of about 4.0 microns as noted above. Similarly, for many applications where relatively low voltages are employed, it is also possible that a suitable capacitor laminate may be constructed for use in a capacitive PCB having a minimum thickness as defined above of even less than 0.75 or 0.5 mils. However, it is further believed that any such refinements within the capacitor laminate would be included within the preceding description and the following claims. Such reduced values of minimum thickness would of course be achieved by using a reduced initial thickness of dielectric.

It has further been found that surface treatment at least of the conductive foil side positioned adjacent the dielectric sheet further enhances capacitive characteristics of the capacitor laminate. Such surface treatment preferably includes initial etching and subsequent application of an oxide layer, preferably an alloy of copper and zinc, for example. However, other conductive alloys or metals may be employed. In any event, it is necessary that the conductive foils meet the requirements of surface roughness or surface variation, as characterized by R values as noted above, only after the surface treatment is complete.

Accordingly, there have been described above a variety of embodiments for a capacitor laminate and capacitive printed circuit board constructed and manufactured according to the present invention. Modifications and variations in addition to those described above will be apparent to those skilled in the art. Accordingly, the scope of the present invention is defined only by the following appended claims which are also set forth as further examples of the invention.

What is claimed is:

1. A capacitor laminate as an intermediate product for use within a laminated capacitive printed circuit board (PCB), comprising two conductive foils and one sheet of dielectric material, the conductive foils and dielectric sheet having characteristics for producing desired capacitance in combination for large numbers of PCB devices, the conductive foils and dielectric sheet each being structurally rigid entities permitting their lamination together and having surface dimensions similar to at least a substantial portion of the PCB, the conductive foils and dielectric sheet being thin to form the capacitor laminate with a uniformly thin dimension suitable for inclusion as an internal layer of the PCB, the two conductive foils being laminated onto opposite sides of the dielectric sheet to form the capacitor laminate as a structurally rigid subassembly facilitating its lamination into the PCB.

2. The capacitor laminate of claim 1 wherein conductivity for each conductive foil is at least equivalent to about a 1 mil thickness of copper.

3. The capacitor laminate of claim 2 wherein the dielectric sheet has an initial thickness of no more than about 2 mils.

4. The capacitor laminate of claim 3 wherein the conductive foils form power and ground planes in the PCB.

5. The capacitor laminate of claim 2 wherein the dielectric sheet has a maximum thickness of about 4 mils and the conductive foils each have a thickness of up to about 2.4 mils.

6. The capacitor laminate of claim 5 wherein one or more capacitor laminates are laminated into the PCB.

7. The capacitor laminate of claim 1 wherein one or more capacitor laminates are laminated into the PCB.

8. The capacitor laminate of claim 7 wherein the conductive foils form power and ground planes in the PCB.

9. The capacitor laminate of claim 7 further comprising multiple devices requiring capacitance being mounted on the PCB and coupled with different portions of the conductive foils.

10. The capacitor laminate of claim 7 wherein one or more capacitor laminates are laminated into the PCB.

11. The capacitor laminate of claim 1 wherein the capacitor laminate is adapted for use with multiple devices respectively coupled to different portions of the capacitor laminate and the two conductive foils each having sufficient conductivity for facilitating random operation of the devices by providing each device with total capacitance including a proportional portion of the capacitor laminate and borrowed or shared capacitance from other portions of the capacitor laminate.

12. The capacitor laminate of claim 1 wherein the two conductive foils each have one surface treated side with surface roughness or surface variation just sufficient to promote adhesion of the one sides to the dielectric sheet, the capacitor laminate being formed from the dielectric sheet and the two conductive foils with the surface treated sides of the conductive foils in intimate contact with opposite sides of the dielectric sheet whereby the dielectric sheet has a minimum thickness between all opposing surface portions of the conductive foils for maintaining adhesion and for developing enhanced capacitive integrity of the capacitor laminate.

13. The capacitor laminate of claim 12 wherein one or more capacitor laminates are laminated into the PCB.

14. The capacitor laminate of claim 1 wherein the capacitor laminate is adapted for use with multiple devices respectively coupled to different portions of the conductive foils, the conductive foils having sufficient conductivity for operation of the devices.

15. The capacitor laminate of claim 14 wherein one or more capacitor laminates are laminated into the PCB.

16. The capacitor laminate of claim 15 wherein the conductive foils form power and ground planes in the PCB.

17. The capacitor laminate of claim 16 wherein multiple devices requiring capacitance are mounted on the PCB and coupled with different portions of the conductive foils.

18. The capacitor laminate of claim 15 wherein multiple devices requiring capacitance are mounted on the PCB and coupled with different portions of the conductive foils.

* * * * *